(12) United States Patent
Dennison et al.

(10) Patent No.: US 7,390,691 B2
(45) Date of Patent: Jun. 24, 2008

(54) INCREASING PHASE CHANGE MEMORY COLUMN LANDING MARGIN

(75) Inventors: Charles H. Dennison, San Jose, CA (US); Ilya V. Karpov, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 165 days.

(21) Appl. No.: 11/262,250

(22) Filed: Oct. 28, 2005

(65) Prior Publication Data

US 2007/0096073 A1 May 3, 2007

(51) Int. Cl.
*H01L 21/00* (2006.01)
*H01L 21/336* (2006.01)

(52) U.S. Cl. .......................... 438/95; 438/260

(58) Field of Classification Search ................ 257/306, 257/310, E27.084–E27.097; 438/240, 253, 438/260, 287, 95
See application file for complete search history.

(56) References Cited

U.S. PATENT DOCUMENTS

| 7,227,171 | B2* | 6/2007 | Bez et al. ................. 257/3 |
| 2004/0087074 | A1 | 5/2004 | Hwang et al. |
| 2005/0029627 | A1 | 2/2005 | Dennison |
| 2005/0156150 | A1* | 7/2005 | Iwasaki et al. ............. 257/2 |
| 2006/0043355 | A1* | 3/2006 | Ryoo et al. ................ 257/2 |
| 2006/0118913 | A1 | 6/2006 | Yi et al. |
| 2007/0082469 | A1* | 4/2007 | Peters .................... 438/584 |

FOREIGN PATENT DOCUMENTS

| EP | 0 269 225 | 6/1988 |
| EP | 1 748 488 | 1/2007 |
| WO | WO 97/05665 | 2/1997 |
| WO | WO 97/40499 | 10/1997 |

OTHER PUBLICATIONS

D-H. Kang et al., *Lower Voltage Operation of a Phase Change Memory Device with a Highly Resistive TiON Layer*, Japanese Journal of Applied Physics, Part 1, vol. 43, No. 8A, Aug. 2004, pp. 5243-5244.

\* cited by examiner

*Primary Examiner*—Calvin Lee
(74) *Attorney, Agent, or Firm*—Trop, Pruner & Hu, P.C.

(57) ABSTRACT

A phase change memory with higher column landing margin may be formed. In one approach, the column landing margin may be increased by increasing the height of an electrode. For example, the electrode being made of two disparate materials, one of which includes nitride and the other of which does not. In another approach, a hard mask is used which is of substantially the same material as an overlying and surrounding insulator. The hard mask and an underlying phase change material are protected by a sidewall spacer of a different material than the hard mask. If the hard mask and the insulator have substantially the same etch characteristics, the hard mask may be removed while maintaining the protective character of the sidewall spacer.

20 Claims, 6 Drawing Sheets

US 7,390,691 B2

INCREASING PHASE CHANGE MEMORY COLUMN LANDING MARGIN

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In accordance with some embodiments of the present invention, the column landing margin of a phase change memory may be improved. The column landing margin is the margin for etching the damascene column groove to define the column conductors without damaging the phase change memory structure. Generally, an upper or top electrode is formed. Then, column connections are formed through an overlying insulating material. These column connections may be defined by vias formed through the overlying insulating material to make electrical contact down to the top electrode.

In some cases, overetching may occur, wherein the vias extend too far downwardly and ultimately overlap into and along side of the phase change memory material. Since a phase change memory includes a chalcogenide material that is sensitive to certain chemicals, adverse consequences may result either from the etching or from subsequent clean steps. Namely, overetching into chalcogenide or other phase change memory layers may occur because of the etching that extends too far downwardly.

Thus, advantageously, the column landing margin is increased so that, even if overetching occurs, the overetching does not reach down to the region underlying the top electrode, damaging more sensitive components thereunder. In accordance with one embodiment of the present invention, column landing margin may be improved by increasing the height of the top electrode. In another embodiment, column landing margin may be improved by using a material as a hard mask over the top electrode that etches substantially similarly to the material utilized to encapsulate the phase change memory and through which the vias are formed.

Figure 1:
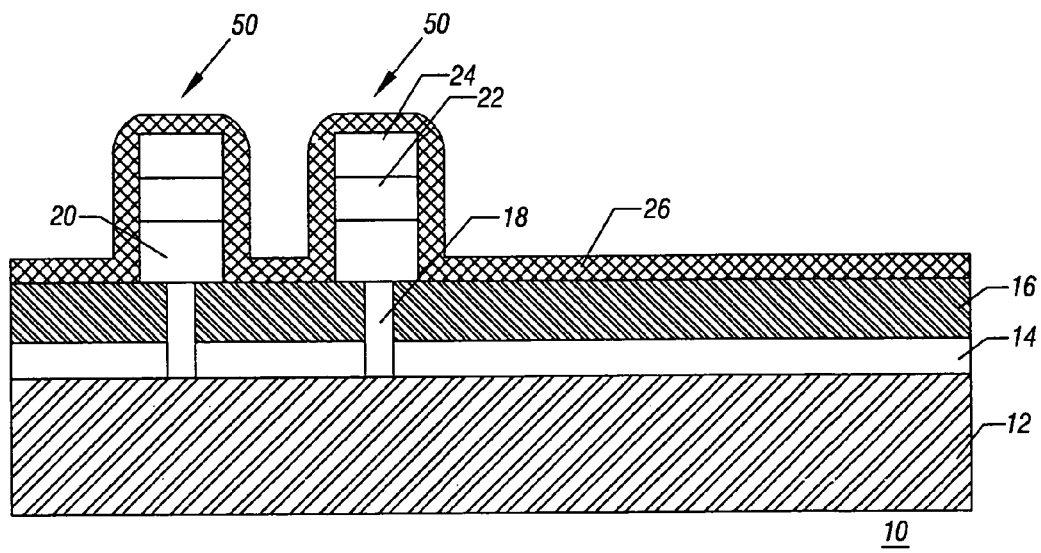
FIG. 1 is an enlarged, cross-sectional view of one embodiment at an early stage of manufacture.

Referring to FIG. 1, in accordance with one embodiment of the present invention, a substrate 10 may be overlaid by a row line conductor metal 12. The substrate 10 may be a semiconductor substrate or interlayer dielectric, as two examples. While the metal 12 is referred to as a row line conductor metal, the terminology "row line" versus "column line" is essentially arbitrary. Thus, the metal 12 may be any conductive line.

Over the metal 12 may be formed a pair of insulating layers 14 and 16. The lower insulating layer may be thinner and may be formed of a first material, while the upper insulating layer 16 may be thicker and formed of a different material. For example, in one embodiment, the layer 14 may be formed of nitride and the layer 16 may be formed of oxide. Thus, the layer 14 may act as an etch stop in certain etching operations described hereinafter.

Through the insulating layers 14 and 16, a pore may be formed which is ultimately filled with a heater material 18. One suitable heater material is titanium silicon nitride. Current passing through the heater material 18 generates heat which is capable of changing the phase of an overlying phase change material 20. Generally, the phase change material 20 may be formed of a chalcogenide.

A stack is defined over the layer 16 that includes the phase change material 20, the top electrode 22, and the hard mask 24. The stack may be made up of the three components which have common sidewalls. The common sidewalls may be achieved by forming a series of layers which are then etched using the same mask.

Each stack forms a memory cell 50. The cells 50 are then overcoated with an encapsulation layer 26. In one embodiment, the encapsulation layer 26 may be formed of nitride.

Figure 2:
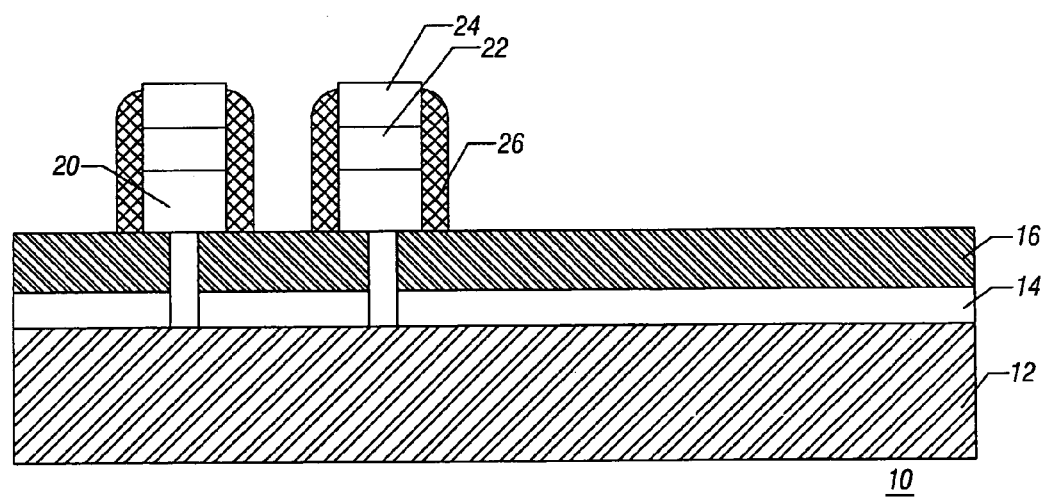
FIG. 2 is an enlarged, cross-sectional view corresponding to FIG. 1 at a subsequent stage of manufacture in accordance with one embodiment.

Then, referring to FIG. 2, the encapsulation layer 26 may be subjected to an anisotropic etch to form sidewall spacers. Namely, the horizontal portions are substantially removed and all that remains is the vertical portions of the layer 26.

Figure 3:
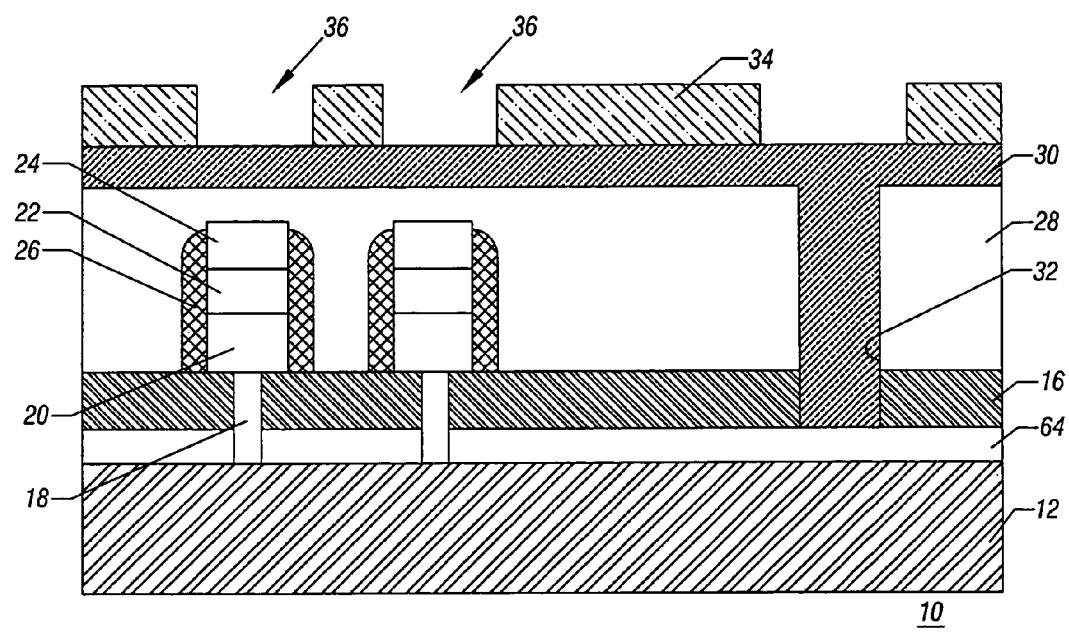
FIG. 3 a cross-sectional view corresponding to FIG. 2 at a subsequent stage of manufacture in accordance with one embodiment.

Referring to FIG. 3, the cells 50 may be covered by an insulator 28. The insulator 28 has pores 32 formed therein. The pore 32 and insulator 28's upper surface are then covered with a sacrificial light absorbing material (SLAM) 30. Finally, over the sacrificial light absorbing material 30 may be defined a photoresist layer with patterned photoresist portions 34 and intervening openings 36.

In some embodiments, the openings 36 define the location of grooves which will extend down through the insulator 28 to the cells 50. The openings 36 may be of substantially the same width so that the resulting grooves have substantially the same depth.

Figure 4:
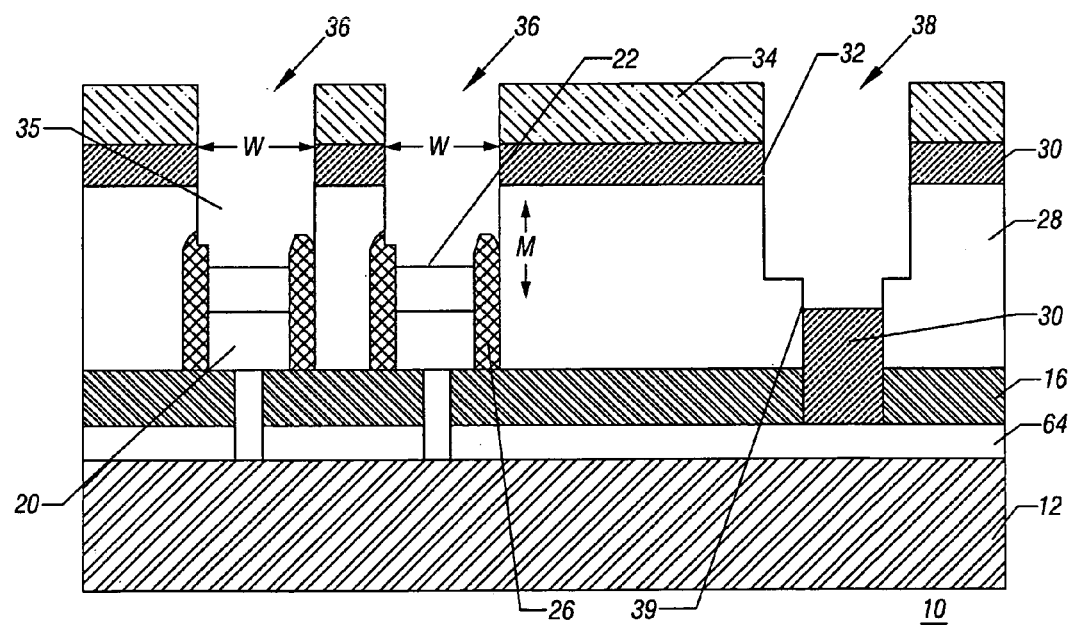
FIG. 4 a cross-sectional view at a subsequent stage of manufacture in accordance with one embodiment.

Referring to FIG. 4, grooves 35 have been formed in the regions exposed to etching processes by the openings 36 between the photoresist portions 34. Note that the width of each region 34 is substantially equal and that the depth of each groove 35 is substantially equal as a result. Since etching high aspect ratio structures is subject to a peculiarity wherein the width of the aperture affects the depth of the resulting groove, it is advantageous to make the widths W substantially the same.

As can be seen in FIG. 4, the grooves 35 extend downwardly to the cells 50 and actually remove the hard mask 24. If the hard mask 24 is made of the same material as the insulator 28 or a material having the same etching characteristics as the insulator 28, the mask 24 and the layer 28 are equally, readily removed. However, if the sidewall spacers 26 are formed of a different material and the etch is not selective of that material, the sidewall spacers 26 may remain substantially intact even when the hard mask 24 and the insulator 28 are etched. Thus, in one embodiment, the insulator 28 and mask 24 are oxide, while the spacers 26 are nitride.

Maintaining the sidewall spacers 26 provides additional column landing margin. The presence of the sidewall spacers 26 protects the sensitive sidewalls of the top electrode 22 and the underlying chalcogenide layer 20. Thus, overetching does not adversely affect either the top electrode 22 or the protected chalcogenide layer 20.

The vertical arrows M indicate the effective column landing margin. In other words, because of the presence of the sidewall spacers 26, the column landing margin is extremely large. It does not matter if some overetching occurs because of the protection afforded by the sidewall spacers 26. The presence of the sidewall spacers 26 is a result of the fact that the spacers 26 are made of a different material than the insulator 28 and the material used for the hard mask 24.

In the same etch that forms the grooves 35 in the memory region, a via 38 is formed in the periphery region. This via 38 is ultimately filled with metal to make a contact down to the row line conductor metal 12. Some of the sacrificial light absorbing material 30 remains in FIG. 4 because the etching has stopped. However, the via 38 may be deeper than the grooves 35 because of the different width of the opening 38 compared to the openings 36 in the photoresist 34. Thus, the trench 38 has a first region which is etched by virtue of the trench 38 provided in the resist 34 and a second region 39 which involves preferentially removing the sacrificial light absorbing material 30 relative to the surrounding layer 28. In other words, the etchant is selective of the sacrificial light absorbing material 30 relative to the layer 28.

Figure 5:
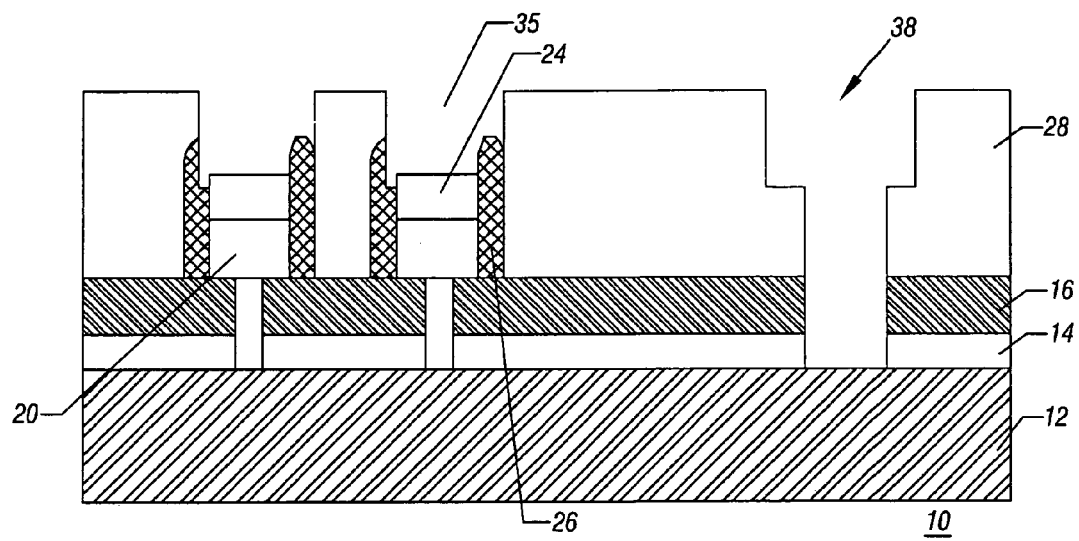
FIG. 5 is a cross-sectional view at a subsequent stage of manufacture in accordance with one embodiment.

As shown in FIG. 5, continued etching removes the rest of the sacrificial light absorbing material 30 and etches through the insulating layer 14 that may be formed of nitride in one embodiment. Then, an etch that may be utilized at this stage etches the remaining portions of the sidewall spacers 26 formed of the same material as the layer 14 in some embodiments. The layer 14 may act as an etch stop for the sacrificial light absorbing material etch.

Figure 6:
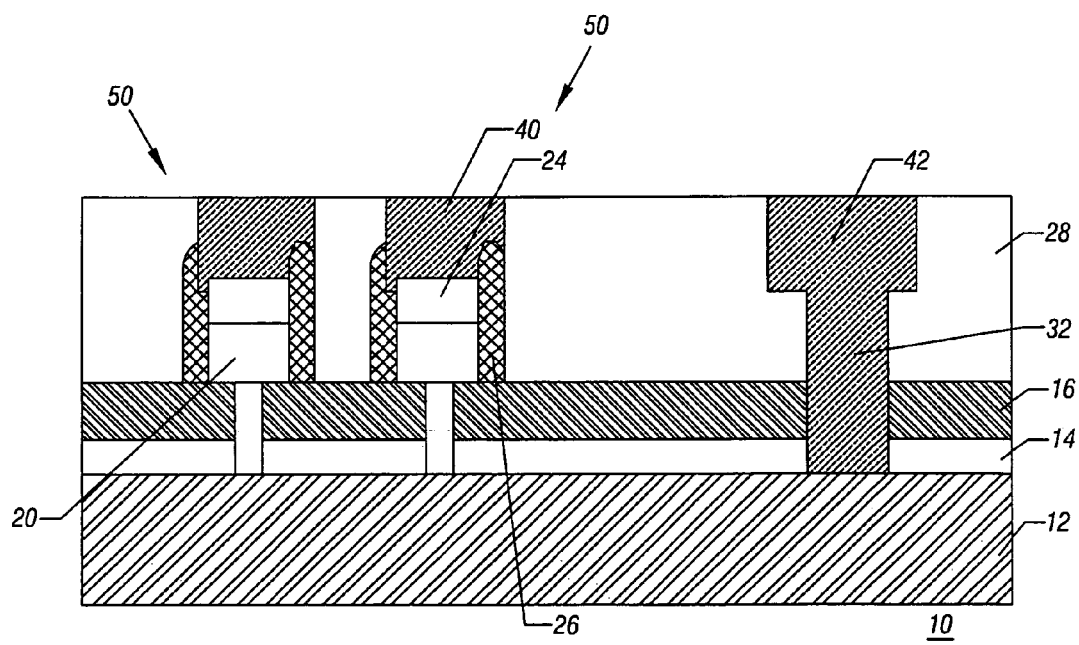
FIG. 6 is a cross-sectional view at a subsequent stage of manufacture in accordance with one embodiment.

Finally, referring to FIG. 6, the vias 35 and 38 may then be filled with a conductive material 40, 42, such as copper. The conductive material 42 may extend down to the row line conductor metal 12 and allows for row signals to be supplied by overlying conductors (not shown). Similarly, column signals are supplied to the column conductors 40 formed in the insulator 28. These signals may communicate with the top electrode 24 in some embodiments.

Figure 7:
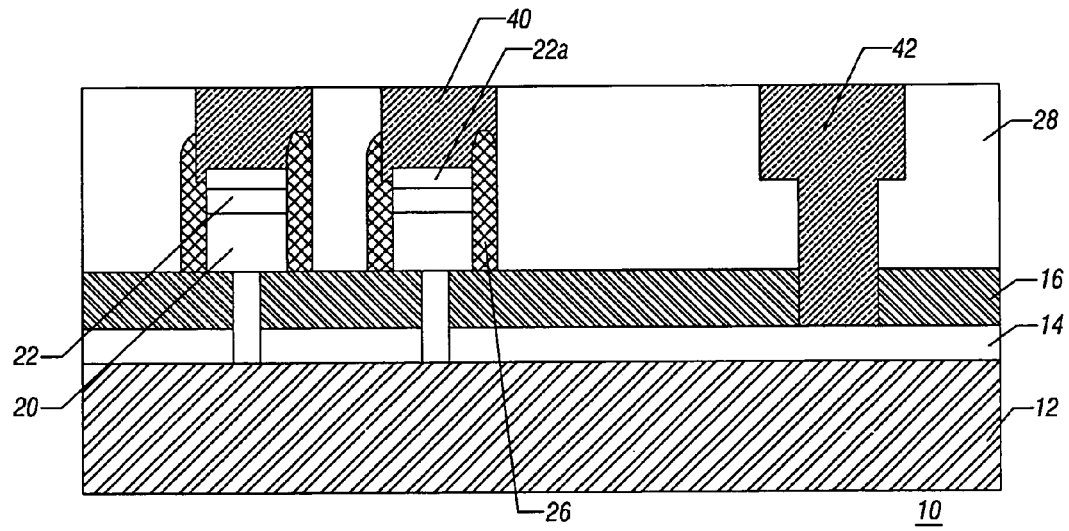
FIG. 7 is a cross-sectional view of another embodiment at a stage corresponding to the stage indicated by FIG. 6.

According to FIG. 7, in accordance with another embodiment of the present invention, a two-layer top electrode 22, 22a may be utilized. In some embodiments, the top electrode 22 may be formed of a nitrided metal. The nitrided metal may be advantageous in contact with the chalcogenide layer 20, for example, because the nitride helps to bind the metal ions, reducing contamination of chalcogenide. The nitrided metal tends to be a high stress material and, therefore, is most advantageously applied in relatively thin layers. However, such thin layers provide less column landing margin. Since the column landing margin extends in a vertical direction, the shorter the electrode 22, the more likely it is that overetching would extend far enough downwardly to ultimately damage the chalcogenide layer 20.

Thus, in some embodiments, a relatively thin top electrode 22 of a nitrided metal, such as titanium nitride or titanium aluminum nitride, is utilized. As a result, good adhesion to the chalcogenide layer 20 may be achieved without contamination problems. Then, a different metal 22a may be added on top of the electrode 22 to provide additional column landing margin. The additional metal 22a may be a lower stress film which can be made significantly thicker. Examples of suitable materials for the metal 22a include titanium, titanium aluminum, aluminum, aluminum silicon, and aluminum silicon copper. Otherwise, the process may be as described before. That is, the techniques described in FIGS. 1-6 may be applied to FIG. 7. However, in some embodiments, those techniques may be unnecessary and the column landing margin supplied by the combined electrode 22, 22a height is sufficient to overcome any problems due to overetching.

Figure 8:
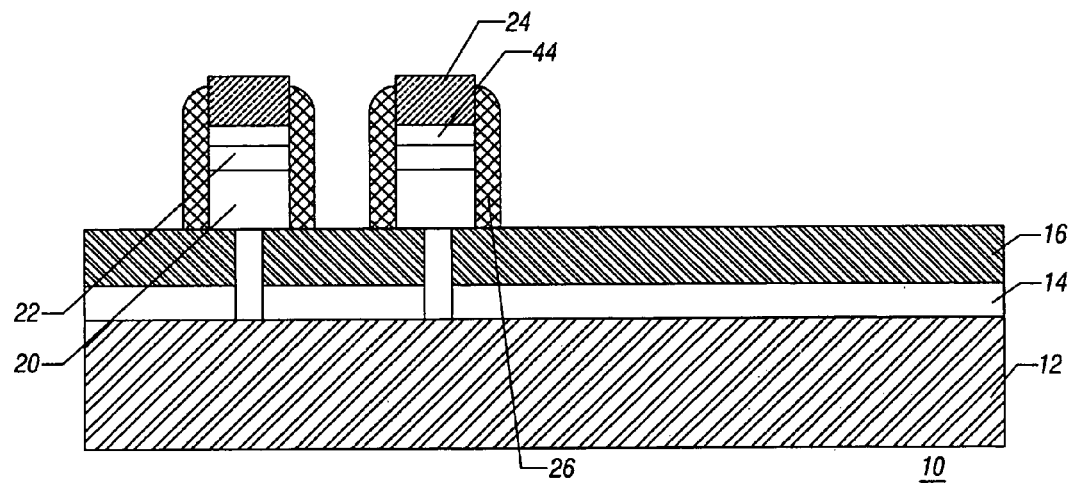
FIG. 8 is an enlarged, cross-sectional view of another embodiment of the present invention at a stage corresponding to the stage indicated in FIG. 2.

Referring to FIG. 8, in accordance with still another embodiment, the hard mask 24 may include a nitride underlayer 44. Then, as shown in FIG. 5, when the nitride layer 14 is etched through, the top electrode 22 remains protected by the overlying nitride layer 44. Thus, the etch of layer 14 also removes the nitride layer 44, reducing the likelihood of significantly etching of the top electrode 24.

Figure 9:
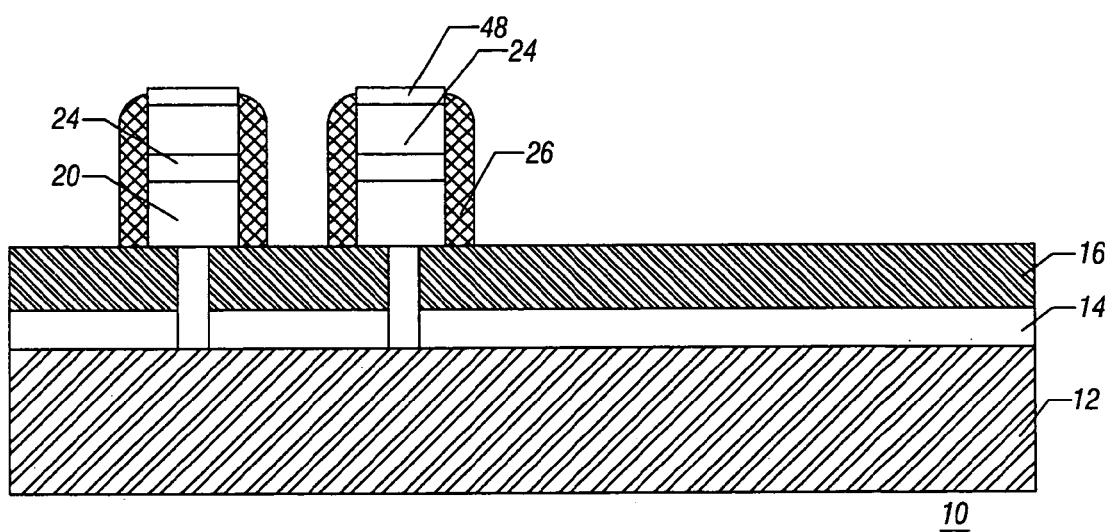
FIG. 9 is a cross-sectional view corresponding to FIG. 2 of another embodiment of the present invention.

Referring finally to FIG. 9, in accordance with still another embodiment, the nitride layer 48 may be positioned over the hard mask layer 24. Sacrificial light absorbing material 32 is removed by additional etching and this etching proceeds through the insulator 14. At the same time, since the insulator 14 and the sidewall spacers 26 may be of the same material, some of the sidewall spacer 26 may also be removed.

Programming of the chalcogenide 20 to alter the state or phase of the material may be accomplished by applying voltage potentials to the conductors 40 and material 42, thereby generating a voltage potential across the select device and memory element. When the voltage potential is greater than the threshold voltages of the memory element 34, then an electrical current may flow through the chalcogenide 20 in response to the applied voltage potentials, and may result in heating of the chalcogenide 20.

This heating may alter the memory state or phase of the chalcogenide 20. Altering the phase or state of the chalcogenide 20 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 10:
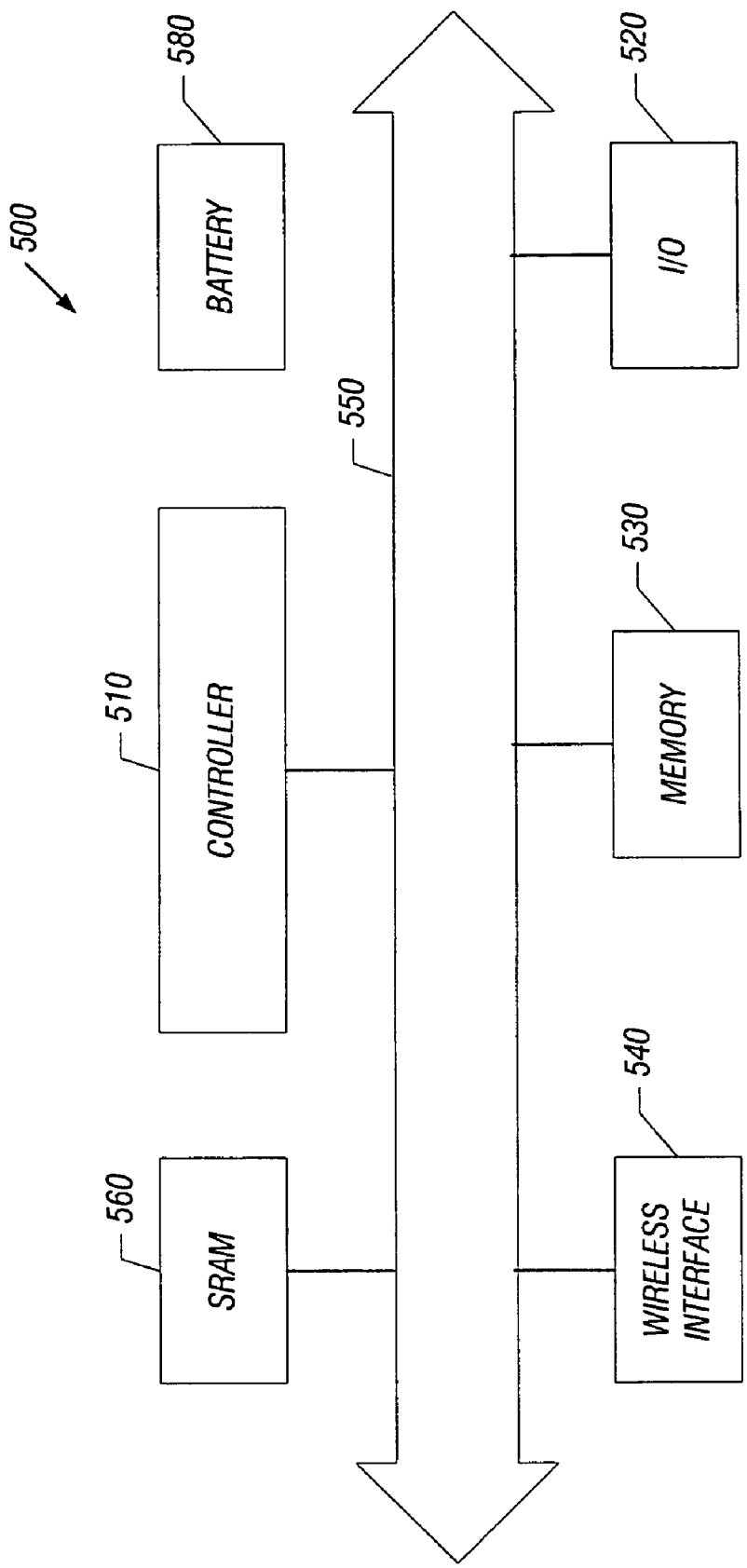
FIG. 10 is a system depiction of one embodiment of the present invention.

Turning to FIG. 10, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a chalcogenide material covered by a mask;
   covering said chalcogenide material and said mask with a sidewall spacer; and
   covering said sidewall spacer with a fill material having substantially the same etch characteristics as said mask.

2. The method of claim 1 including forming said fill material and said mask of the same material.

3. The method of claim 2 including forming said fill material and said mask of a first material and forming said sidewall spacer of a second material different from said first material.

4. The method of claim 3 including forming said fill material and said mask of oxide.

5. The method of claim 4 including forming said sidewall spacer of nitride.

6. The method of claim 1 including forming said mask over a conductive electrode and forming said conductive electrode over said chalcogenide material.

7. The method of claim 6 including forming a via through said fill material and through said mask to said conductive electrode.

8. The method of claim 7 including forming a passivation layer over said mask, said passivation layer being formed of a material different from the materials used as said fill material and said mask.

9. The method of claim 7 including etching a via through said fill material, removing said mask while leaving said sidewall spacer substantially unetched.

10. The method of claim 7 including forming a nitride layer under said file material and forming said mask with a nitride.

11. A semiconductor structure comprising:
    a phase change material;
    a mask over said phase change material;
    a fill material over said mask;
    said mask and said fill material having substantially the same etch characteristics; and
    a sidewall spacer on said mask and said phase change material.

12. The structure of claim 11 where said mask and said fill material are made of the same material.

13. The structure of claim 12 wherein said mask and said fill material are formed of oxide.

14. The structure of claim 11 including a passivation layer over said mask.

15. The structure of claim 14 wherein said passivation layer is formed of a nitride.

16. The structure of claim 11 including an electrode between said mask and said phase change material.

17. The structure of claim 16 wherein said electrode is formed of two layers of distinct materials.

18. The structure of claim 17 wherein one of said layers includes nitride and the other of said layers does not include nitride.

19. The structure of claim 11 wherein said mask includes a layer of oxide and a layer of nitride.

20. The structure of claim 19 wherein said mask includes a layer of oxide over a layer of nitride.

* * * * *